United States Patent
Valadon

(10) Patent No.: US 8,230,307 B2
(45) Date of Patent: Jul. 24, 2012

(54) METRIC CALCULATIONS FOR MAP DECODING USING THE BUTTERFLY STRUCTURE OF THE TRELLIS

(75) Inventor: Cyril Valadon, Letchworth (GB)

(73) Assignees: MStar Semiconductor, Inc. (KY); MStar Software R&D, Ltd., Shenzhen (CN); MStar France SAS, Issy les Moulineaux (FR); MStar Semiconductor, Inc. (TW)

( * ) Notice: Subject to any disclaimer, the term of this patent is extended or adjusted under 35 U.S.C. 154(b) by 1042 days.

(21) Appl. No.: 11/817,697

(22) PCT Filed: Feb. 24, 2006

(86) PCT No.: PCT/GB2006/000652
§ 371 (c)(1),
(2), (4) Date: Jul. 9, 2008

(87) PCT Pub. No.: WO2006/092564
PCT Pub. Date: Sep. 8, 2006

(65) Prior Publication Data
US 2009/0132896 A1    May 21, 2009

(30) Foreign Application Priority Data
Mar. 3, 2005    (GB) .................................. 0504483.9

(51) Int. Cl.
    *H03M 13/25*    (2006.01)
(52) U.S. Cl. .................... 714/792; 714/786; 714/796
(58) Field of Classification Search .................. 714/792
    See application file for complete search history.

(56) References Cited

U.S. PATENT DOCUMENTS

| 6,128,765 A * | 10/2000 | Ross et al. ..................... 714/786 |
| 2001/0016932 A1 * | 8/2001 | Tarrab et al. .................. 714/790 |
| 2002/0061069 A1 * | 5/2002 | Tran et al. ..................... 375/265 |
| 2002/0162074 A1 * | 10/2002 | Bickerstaff .................... 714/792 |
| 2003/0093753 A1 * | 5/2003 | Okamura et al. ............. 714/792 |
| 2003/0226096 A1 * | 12/2003 | Shen et al. .................... 714/796 |
| 2010/0077282 A1 * | 3/2010 | Shen et al. .................... 714/780 |

FOREIGN PATENT DOCUMENTS

| EP | 1024604 A2 | 8/2000 |
| EP | 1204210 A1 | 5/2002 |
| EP | 1271789 A1 | 1/2003 |
| WO | 0229977 A2 | 11/2002 |
| WO | 03015290 A1 | 2/2003 |
| WO | 03105001 A1 | 12/2003 |

* cited by examiner

*Primary Examiner* — Scott Baderman
*Assistant Examiner* — Justin R Knapp
(74) *Attorney, Agent, or Firm* — Edell, Shapiro & Finnan, LLC

(57) ABSTRACT

A method of calculating backward computations branch metrics for a butterfly in a trellis of a MAP-genre decoding algorithm includes providing initialized branch metrics for the transitions in the butterfly and incrementing the branch metrics with a group of data values corresponding to the transitions in accordance with control signals derived from the butterfly index and one or more polynomials describing tap positions of the encoding equipment to whose operation the trellis relates, wherein the group comprises systematic bit and parity bit values.

17 Claims, 10 Drawing Sheets

METRIC CALCULATIONS FOR MAP DECODING USING THE BUTTERFLY STRUCTURE OF THE TRELLIS

The invention relates to apparatus for, and methods of, calculating metrics associated with a trellis representing a signal to be recovered.

In digital communication systems, Forward Error Correction (FEC) coding can be used in order to improve the reliability of the transmission link. Turbo coding schemes [C. Berrou, A. Glavieux and P. Thitimajshima, *Near Shannon Limit Error-Correcting Coding and Decoding: Turbo-Codes*, ICC 1993, Geneva, Switzerland, pp. 1064-1070, May 1993] belong to the family of FEC codes and are currently being used in a number of communication systems. For example, the 3GPP standard makes use of Turbo codes to help the receiver recover the transmitted information.

Turbo-codes are built from the parallel (or serial) concatenation of two (or more) constituent codes (see FIG. 1 describing the Turbo code defined by the 3GPP standard). The constituent codes are systematic recursive convolutional codes. For the 3GPP Turbo code, the constituent codes are of rate ½ and constraint length 4. The sequence of bits to code is passed directly to the first constituent code, but is interleaved at the input of the second constituent code. A special mode of operation is used for the tail bits so that both constituent codes end in the zero state at the end of the transmission. This mode of operation is illustrated in FIG. 1 by the dotted lines.

In order to decode the Turbo codes with an acceptable complexity, an iterative decoding algorithm is usually selected. FIG. 2 describes such an iterative approach. The constituent codes are decoded separately using the two Soft-Input, Soft-Output (SISO) decoders 10 and 12. Information obtained using the decoding of the first constituent code by SISO decoder 10 is passed to the SISO decoder 12 and, similarly, information derived from the decoding of the second constituent code by SISO decoder 12 is used to help the decoding process performed by SISO decoder 10.

For the first decoding iteration, the soft decisions corresponding to systematic bits and the soft decisions corresponding to the $1^{st}$ parity bits are used by SISO decoder 10 in order to decode the first constituent code. No a priori information is used at this point since none is usually available for the first decoding iteration. The SISO decoder 10 outputs the Log Likelihood Ratios (LLRs) of the transmitted bits. The LLRs indicate how likely it is for a 0 or a 1 to have been transmitted. They are used to help the decoding performed by SISO decoder 12. However, they cannot be used directly and need to be processed so that they are in a format suitable to be input to SISO decoder 12. First, the a priori information needs to be subtracted, at 14, from the LLR, although it should be borne in mind that no a priori information is available for the first decoding iteration. This quantity formed by the difference between the LLRs and the a priori information is called extrinsic information and corresponds to the information generated by SISO decoder 10 on the transmitted bits. Moreover, these extrinsic values need to be interleaved, at 16, in order to replicate the interleaving applied at the transmitter on the sequence of bits to be coded. The decoding performed by SISO decoder 12 uses the extrinsic information generated by SISO decoder 10 with the soft decisions corresponding to the systematic bits and the soft decisions corresponding to $2^{nd}$ parity bits. At the output of SISO decoder 12, a new sequence of LLRs is generated for the sequence of transmitted bits. The LLRs are used to calculate the extrinsic information generated by SISO decoder 12. After de-interleaving, this extrinsic information can be used, in subsequent decoding iterations, by SISO decoder 10 as a priori information. This decoding process is iterated a number of times so that the LLRs generated by the SISO decoders 10 and 12 are gradually improved. These refinements of the LLRs are fed to the different SISO decoding stages so that the overall decoding algorithm converges to an estimated sequence of the transmitted bits close to the MAP solution. At the end of the $N_{TCIterations}$ decoding iterations, the polarity of estimated transmitted bits is set according to the sign of the LLRs.

The choice of the algorithm used within the SISO decoders 10 and 12 is very important, as it will impact both the decoding performance and the complexity of the receiver. The Max-Log-MAP algorithm [W. Koch and A. Baier, *Optimum and sub-optimum detection of coded data disturbed by time-varying intersymbol interference*, GLOBECOM 90, pp. 1679-1684, December 1990] is one possible algorithm offering a good trade-off between performance and complexity. The case where SISO decoders 10 and 12 use the Max-Log-MAP algorithm will now be described.

FIG. 3 presents the different processing stages for SISO decoder 10 based on the Max-Log-MAP algorithm. The different input and output information samples of the processing stages are also presented.

FIG. 4 presents the different processing stages for SISO decoder 12. It can be seen that most processing stages for the SISO decoder 12 are identical to the processing stages for SISO decoder 10. The only difference between the SISO decoders 10 and 12 is that interleaving/de-interleaving is required for the processing of the second parity samples.

It can be seen from FIG. 3 and FIG. 4 that the processing shown there can be decomposed into two main phases, labelled "forward processing" and "backward processing". The results of the forward processing phase are retrieved during the backward processing phase and combined to derive the LLRs. It can also be seen that both forward and backward computation phases include a 'butterflies update' stage.

In FIGS. 3 and 4, in order to keep the receiver complexity as low as possible, all the different arithmetic computations are performed using fixed point representations of the different numbers. The word sizes of those different numbers are described in FIG. 3 and FIG. 4. For example, each a priori information sample is stored using Bapp bits. Similarly, each systematic sample and each parity sample is stored using Bsd bits.

In order to calculate the LLRs, the path metrics calculated during the 'butterflies update' stage of the forward processing are combined with the path metrics generated during the backward processing. Hence, the path metrics generated during forward processing need to be stored in a buffer until they are used by the backward processing stage. In order to keep the receiver implementation complexity as low as possible, it is very important to minimise the size of this buffer. The number of memory bits required to store the path metrics calculated during the forward processing increases linearly with (1) the number of bits to be decoded, also referred to as code block size, (2) the number of states in the trellis representing the constituent code and (3) the number of bits required to accurately represent each path metric. The number of states in the trellis is defined by the structure of the code imposed by the transmitter and can therefore not be changed to reduce the receiver memory requirements. In order to reduce the impact of the code block size on the memory requirements, it is possible to use decoding techniques operating on windows of the received signal rather than on the whole sequence [*Performance analysis of Turbo decoder for 3GPP standard using the sliding window algorithm*, M.

Marandian, J. Fridman, Z. Zvonar, M. Salehi, PIMRC 2001]. Finally, the number of bits required to accurately represent the results of the path metric computations should be kept as low as possible.

The operation of the SISO decoder 10 will now be described in more detail. It will be apparent that the SISO decoder 12 operates in much the same way although the interleaving of the parity samples does of course need to be taken into account.

On the transmitter side, each information bit $x_k$ is coded to generate a parity sample $z_k$ that is output alongside $x_k$. FIGS. 1 and 5 describe how the bits $z_k$ are generated. The trellis states in FIG. 5 correspond to the state of the memory elements in the encoder described in FIG. 1 (in this case the content of the most recent memory element corresponds to the LSB of the state index rendered in binary format in FIG. 5). After coding, the N sets of samples $\{x_k, z_k\}_{k \in \{1, \ldots, N\}} = R_1^N$ are then transmitted (N is the length of the code block).

On the receiver side, estimates of the transmitted coded samples $\{\hat{x}_k, \hat{z}_k\}_{k \in \{1, \ldots, N\}}$ are first produced. The aim of the Turbo decoding architecture is to produce the LLRs of the different transmitted bits. The likelihood ratio of the $k^{th}$ bit can be expressed as:

$$\lambda_k = \frac{P(x_k = 1 \mid R_1^N)}{P(x_k = 0 \mid R_1^N)}$$

The proposed Turbo decoding architecture produces scaled estimates of the logarithm value of the likelihood ratio:

$$\tilde{\lambda}_k = \frac{\log(\lambda_k)}{L_c}$$

The value of the parameter $L_c$ varies with the quality of the transmission link and can be assumed to be fixed for the whole received code block.

The estimates of the LLRs of the different transmitted bits are produced by iterating a number of times the processing stages presented in FIG. 3 and FIG. 4. The decoding in the different stages is improved by updating the a priori information $La_k^I$ of the bits being transmitted. The a priori information is given by:

$$La_k^I = \log\left(\frac{P(x_k = 1)}{P(x_k = 0)}\right)$$

where I is the iteration number.

The various computations to be performed for the different processing stages presented in FIG. 3 and FIG. 4 will now be described.

The M forward path metrics, $\tilde{\alpha}_k^m | m \in \{1, \ldots, M\}$, for the different states in the trellis corresponding to the information bit $x_k$ are calculated using the received samples $\{\hat{x}_{k-1}, \hat{z}_{k-1}\}$ and the path metrics associated with the information bit $x_{k-1}$ using the following equation:

$$\tilde{\alpha}_k^m = \max_{j \in \{0,1\}} \left( \tilde{\alpha}_{k-1}^{B(j,m)} + j\left(\hat{x}_{k-1} + \left(\frac{La_{k-1}^I}{L_c}\right)\right) + \hat{z}_{k-1} c^{j,B(j,m)} \right)$$

B(j,m) denotes the trellis state going backwards in time from state m on the previous branch corresponding to input j and $c^{j,B(j,m)}$ denotes the parity bit corresponding to the transition leading into state m from state B(j,m).

It can be seen from the above equation that the different path metrics for the whole code block (or window if windowing techniques are being used) can be generated by processing the received samples in increasing order of k. It can also been seen from FIG. 5, that the processing does not need to be performed for each state independently. Across the whole trellis, two ending states (states at time k+1) are always associated with the same two starting states (states at time k). Hence, the processing is performed using a two state-to-two state connection. This is why this processing is referred to as forward 'butterflies update'.

The different metrics for the different states and all the information bits in the code block (or in the window if windowing techniques are being used) need to be stored so that they can be combined with the backward computations in order to generate the different LLRs.

The backward 'butterflies update' computations are very similar to the computations performed during the forward 'butterflies update' stage. The M backward path metrics, $\tilde{\beta}_k^m | m \in \{1, \ldots, M\}$, for the different states in the trellis corresponding to the information bit $x_k$ are calculated using the received samples $\{\hat{x}_k, \hat{z}_k\}$ and the path metrics associated with the information bit $x_{k+1}$ using the following equation:

$$\tilde{\beta}_k^m = \max_{j \in \{0,1\}} \left( \tilde{\beta}_{k+1}^{F(j,m)} + j\left(\hat{x}_k + \left(\frac{La_k^I}{L_c}\right)\right) + \hat{z}_k c^{j,F(j,m)} \right)$$

F(j,m) denotes the trellis state going forward in time from state m on the branch corresponding to input j and $C^{j,F(j,m)}$ denotes the parity bit associated with the transition from state F(j,m) into state m.

Some intermediate values created in the generation of the backward path metrics are kept so that they can be used when the forward and backward computations are combined to generate the LLRs. Those intermediate values, $(\tilde{\gamma}_k^{j,m})_{j \in \{0,1\}}$, are computed using the following equation:

$$\tilde{\gamma}_k^{j,m} = \tilde{\beta}_{k+1}^{F(j,m)} + j\left(\hat{x}_k + \frac{La_k^I}{L_c}\right) + \hat{z}_k c^{j,F(j,m)}$$

$\tilde{\gamma}_k^{j,m}$ represents the backward metric ending in the trellis state m for an information bit j.

The backward 'butterflies update' computations can be simply expressed using those intermediate variables using the following equation:

$$\tilde{\beta}_k^m = \max_{j \in \{0,1\}} (\tilde{\gamma}_k^{j,m})$$

For each information bit $x_k$, the results of the current backward 'butterflies update' computations are combined with the stored forward path metrics so that the LLRs can be calculated using the following equation:

$$\tilde{\lambda}_k = \max_{m \in \{1, \ldots, M\}} (\tilde{\alpha}_k^m + \tilde{\gamma}_k^{1,m}) - \max_{m \in \{1, \ldots, M\}} (\tilde{\alpha}_k^m + \tilde{\gamma}_k^{0,m})$$

The a priori information for the information bit $x_k$ to be used at the next decoding iteration is calculated using the LLRs, the systematic sample and the current a priori information according to the following equation:

$$\frac{La_k^{I+1}}{L_c} = \left( \tilde{\lambda}_k - \left( \hat{x}_k + \frac{La_k^I}{L_c} \right) \right)$$

Note that at the last decoding iteration, this computation does not need to be performed. The decision on the transmitted bit can be performed directly using the LLRs.

According to one aspect, the invention provides a method of calculating branch metrics for a butterfly in a trellis of a MAP-genre decoding algorithm, the method comprising providing initialised branch metrics for the transitions in the butterfly and incrementing the branch metrics with a group of data values corresponding to said transitions in accordance with control signals derived from the butterfly index and one or more polynomials describing tap positions of the encoding equipment to whose operation the trellis relates, wherein said group comprises systematic bit and parity bit values.

The invention also consists in apparatus for calculating branch metrics for a butterfly in a trellis of a MAP-genre decoding algorithm, the apparatus comprising means for providing initialised branch metrics for the transitions in the butterfly and means for incrementing the branch metrics with a group of data values corresponding to said transitions in accordance with control signals derived from the butterfly index and one or more polynomials describing tap positions of the encoding equipment to whose operation the trellis relates, wherein said group comprises systematic bit and parity bit values.

The invention also relates to methods of, and apparatus for, updating state metrics in a trellis.

The proposed invention is not limited in its field of application to Turbo decoding architectures using the Max-Log-MAP algorithm. The invention can be used for receivers using any Turbo decoding architectures based on the MAP algorithm or on derived versions of the MAP algorithm.

The proposed invention can be used for both Turbo decoding receivers using windowing techniques and Turbo decoding receivers that do not use windowing techniques.

The invention may be realised in hardware, software on a processor, or a combination thereof.

By way of example only, certain embodiments of the invention will now be described with reference to the accompanying drawings, in which:

FIG. 1 presents the Turbo coding mechanism from the 3GPP standard.

Figure 5:
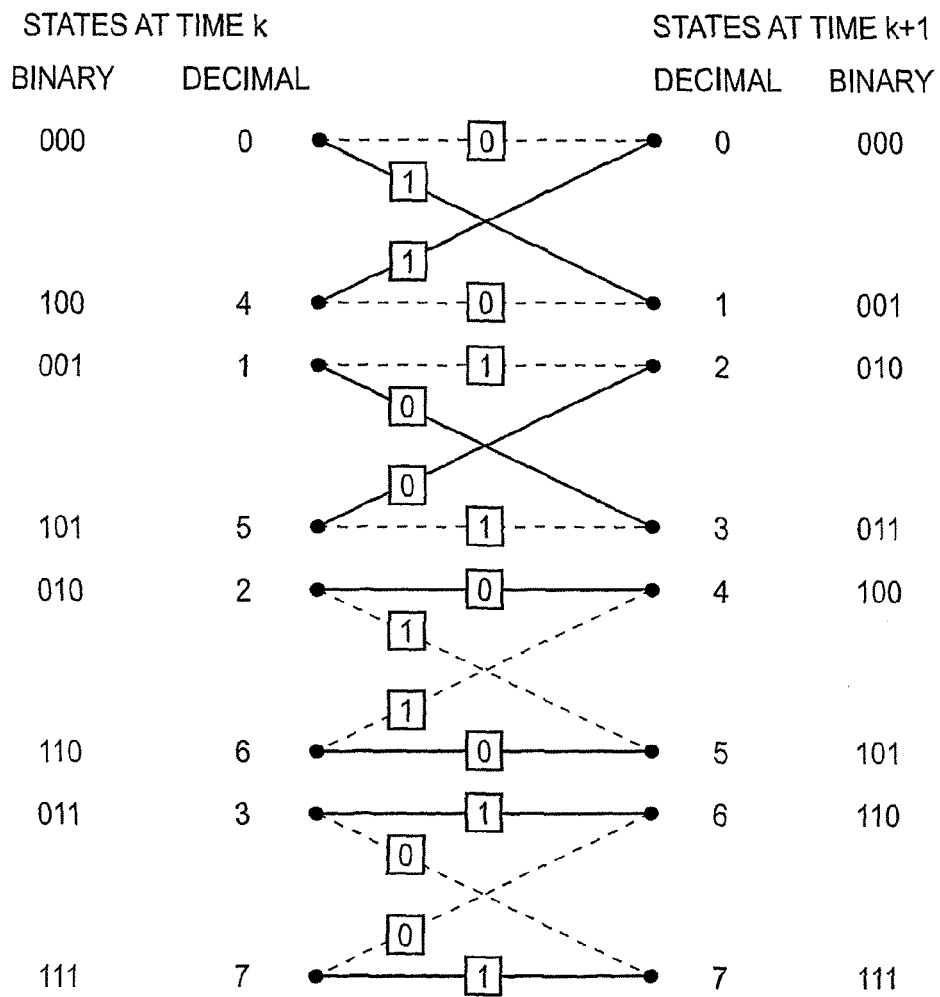
Figure 6:
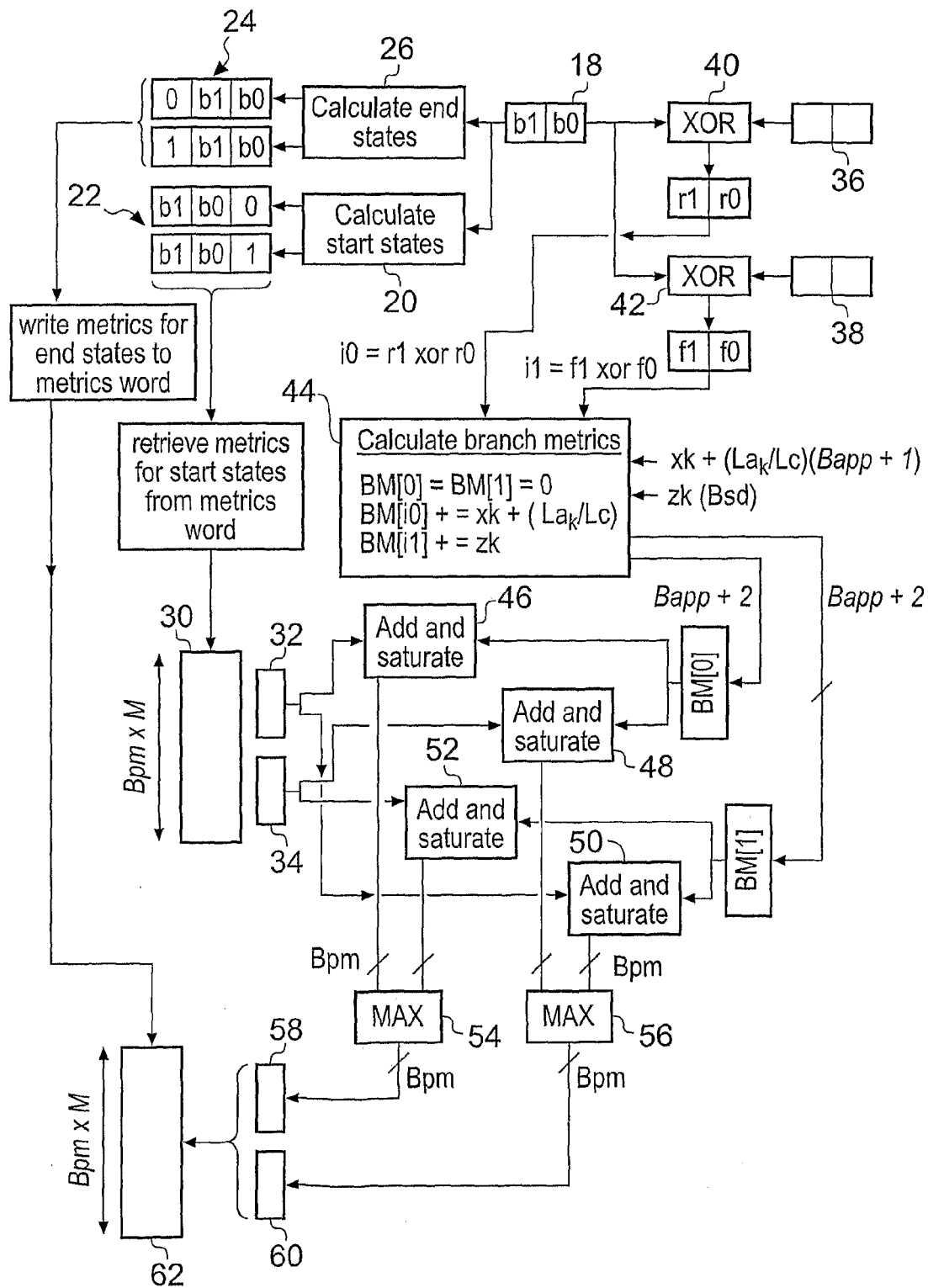
Figure 7:
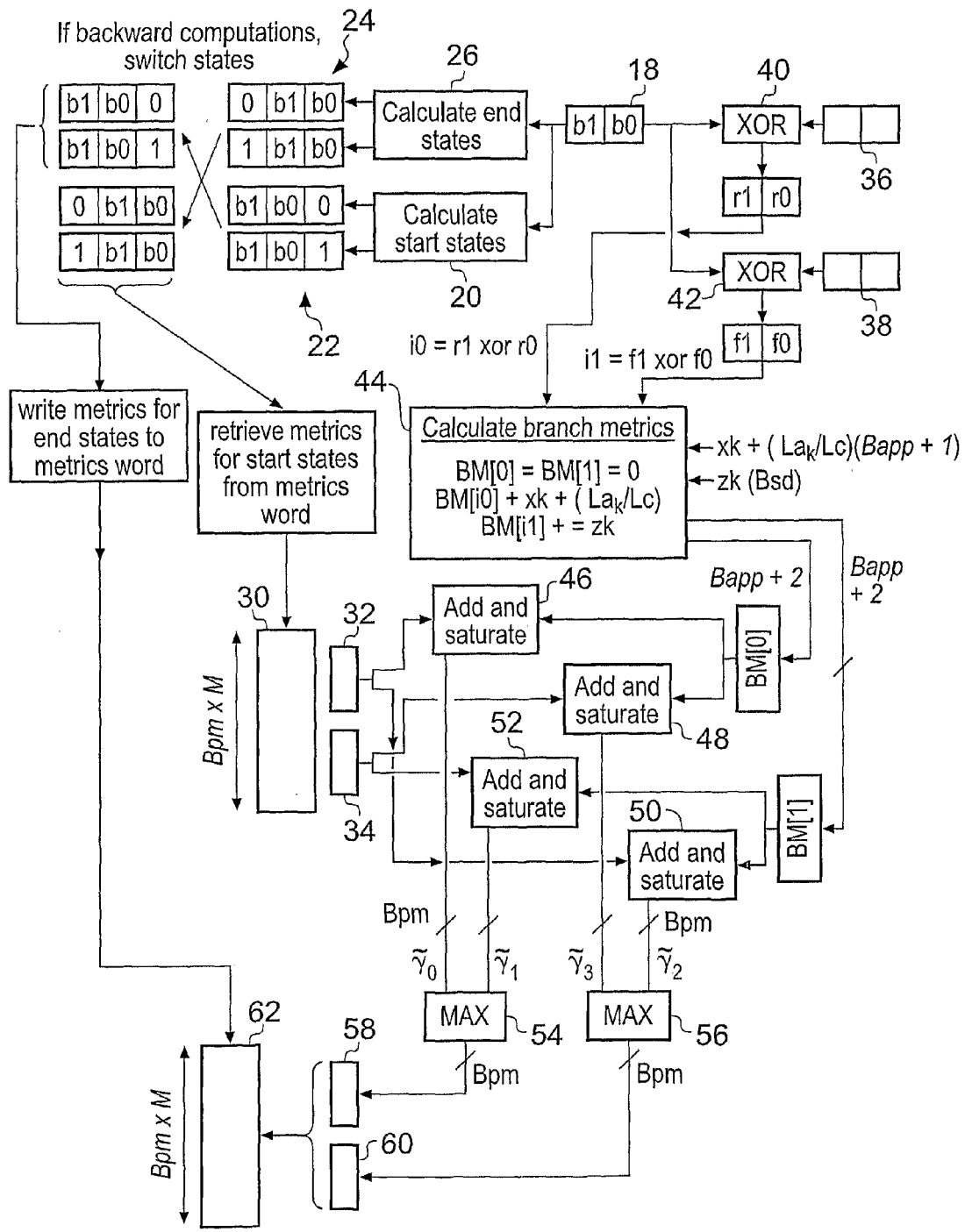
Figure 8:
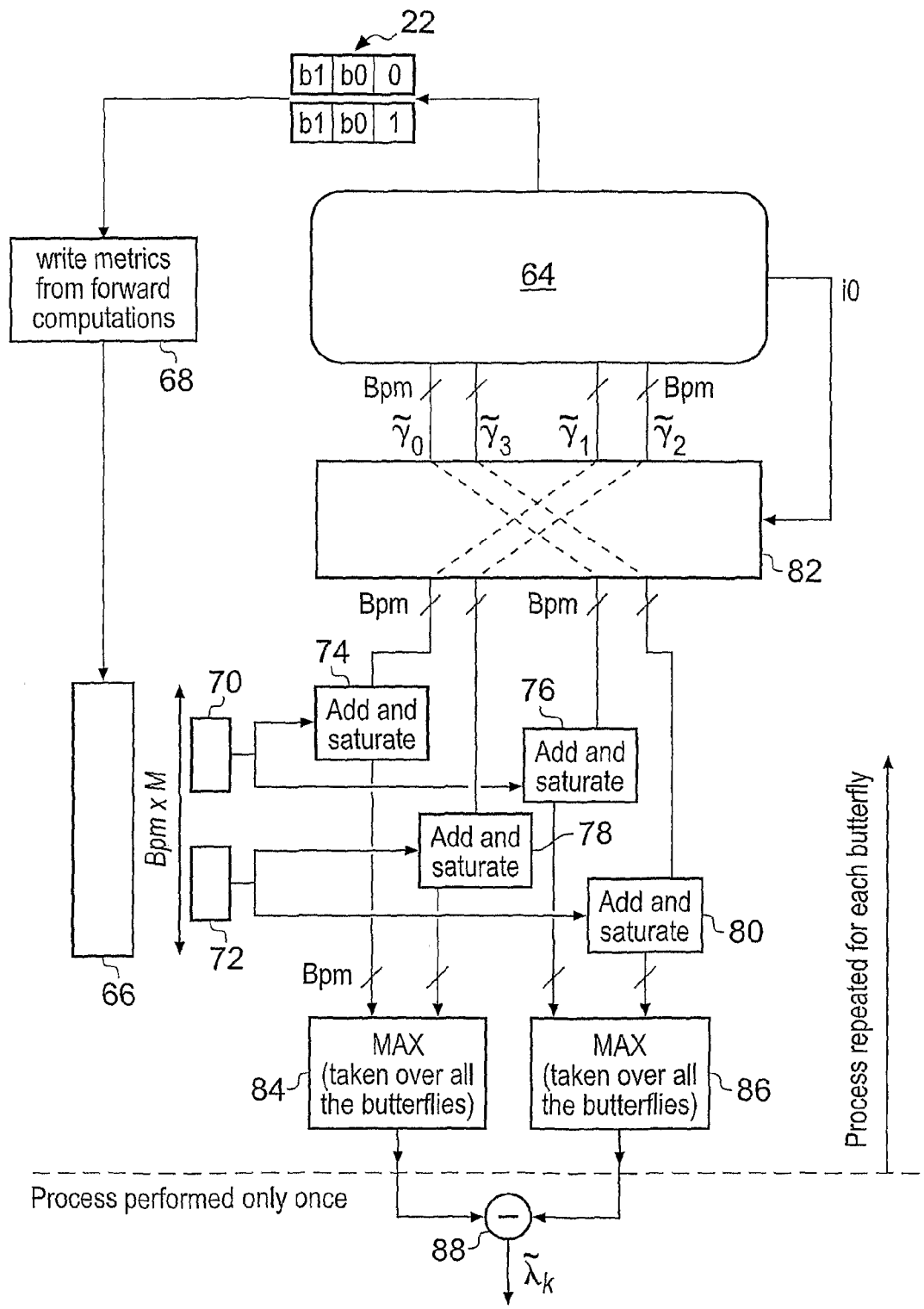
Figure 9:
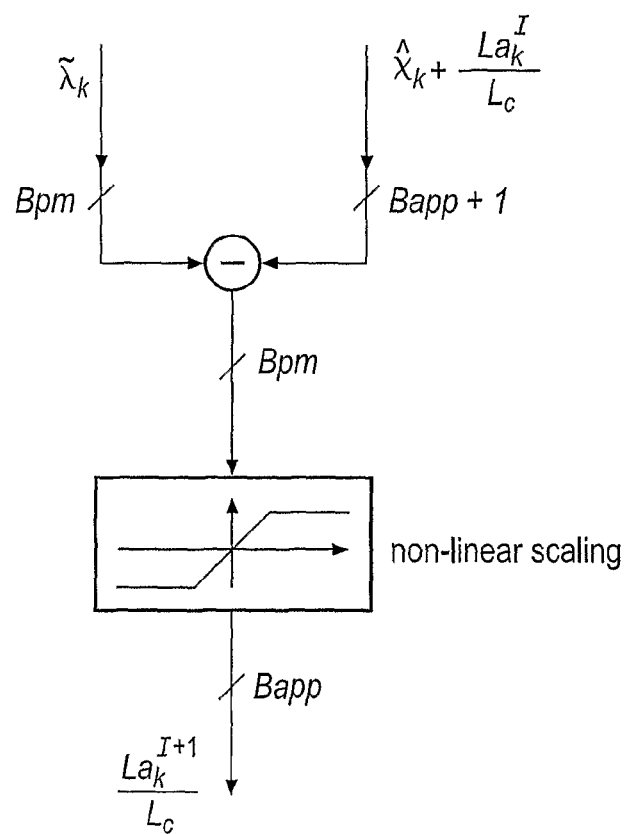

FIG. 5 presents the relationship between the transmitted information bits and the coded bits for the Turbo code specified by 3GPP;

FIG. 6 describes computations performed during forward 'butterflies update' processing in a Turbo decoder according to an embodiment of the invention;

FIG. 7 describes computations performed during both forward and backward 'butterflies update' processing in a Turbo decoder according to an embodiment of the invention;

FIG. 8 presents computations performed to derive LLR values in a Turbo encoder according to an embodiment of the invention; and FIG. 9 describes computations performed to calculate a-priori information from LLR values in a Turbo decoder according to an embodiment of the invention.

Figure 10:
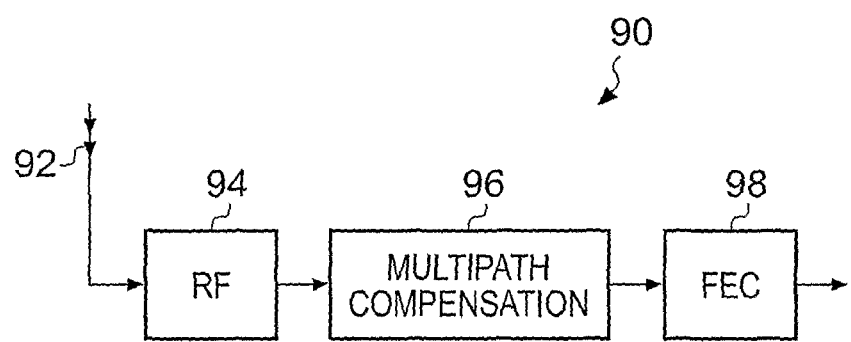

FIG. 10 illustrates a mobile telephone.

The description of the different methods forming part of the proposed invention will be made for the Turbo code defined in the 3GPP standard. Note however that the proposed techniques can be applied to any Turbo code (for example the number of constituent codes is not limited to being equal to 2 and the constraint length is not limited to 4).

An embodiment of the invention concerned with the calculation of the forward path metrics $\tilde{\alpha}_k^m$, the backward path metrics $\tilde{\beta}_k^m$ and the LLRs for SISO decoder 10 of the Turbo decoder of FIG. 1 will now be described. It will be apparent that the following description can be adapted through minor adjustments to take into account the interleaving that occurs between the constituent encoders of the Turbo encoder in order to describe the operation of SISO decoder 12.

Figure 1:
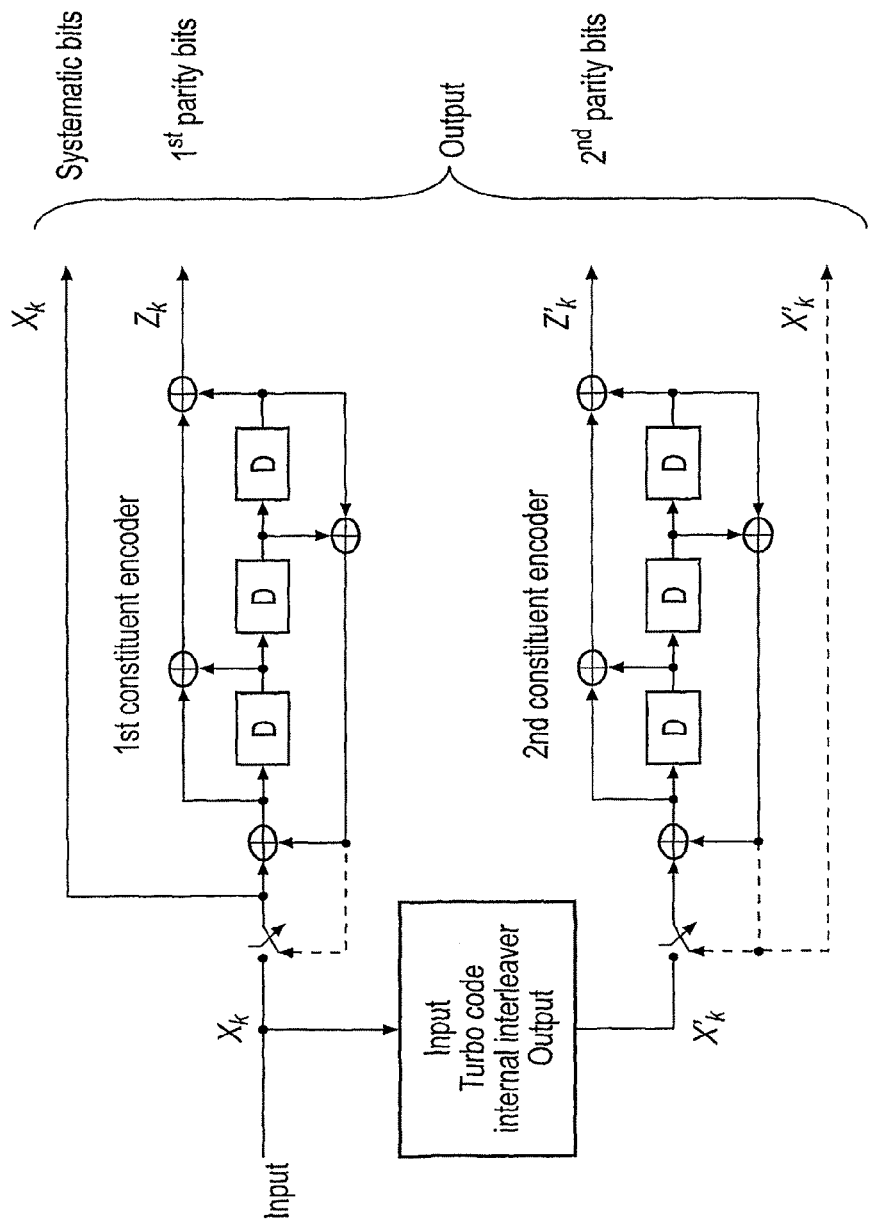
Figure 2:
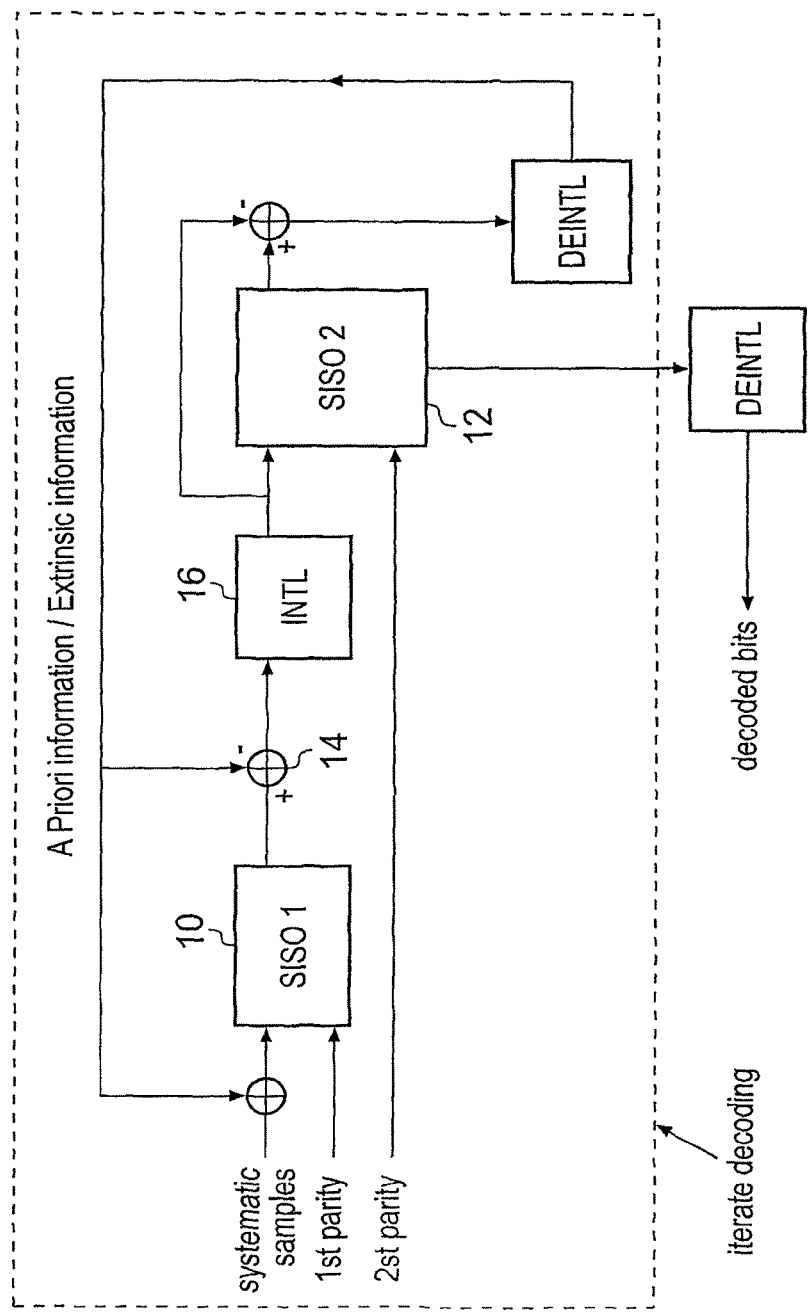
FIG. 2 illustrates components of an iterative Turbo decoding algorithm.

A few observations on the structure of the trellis shown in FIG. 5, which it will be recalled, relates to either of the constituent encoders of FIG. 1, can be made. The four butterflies shown in FIG. 5 can be numbered from 0 to 3, starting at the top. This numbering of the butterflies is often referred to as a butterfly index. For example, the third butterfly has a butterfly index of 2 which is 10 in binary. If this binary number is prefixed with 1 or 0, the starting states of the butterfly are produced. On the other hand, if this binary number is suffixed with 1 or 0, the ending states of the butterfly are produced. Let b denote the butterfly index. In this case, it can be seen from FIG. 5 that for each butterfly b the pair of starting states $$\left\{b, b+\frac{M}{2}\right\}$$

connects with the pair of ending states $\{(b\times2), (b\times2)+1\}$. This is the reason why the processing can be grouped in pairs of two states.

It is important to note that a given connection in a given butterfly and the same connection in another butterfly do not relate to the transmission of the same pair of information bit and parity bit values. In FIG. 5, the parity bits that are transmitted by the transitions are shown in boxes located on the transitions. Moreover, the designation of a transition as a broken line denotes that the transition corresponds to the transmission of an information bit equal to 0 and the designation of a transition as a solid line denotes that the transition corresponds to the transmission of an information bit equal to 1. For example, in the first two butterflies (i.e., where b=0 or 1) the connection from starting state b to ending state b×2 is associated with an information bit equal to 0. On the other hand, for the last two butterflies in the trellis, the same state connection is associated with an information bit equal to 1. The fact that the state transitions are not associated with the same information bits across the whole trellis is specific to recursive codes (non-recursive convolutional codes have identical butterflies) and complicates the implementation of the butterfly processing.

It can also been seen from FIG. 5 that the code structure provides information on the parity of the coded samples. For a given ending state, the parity bits of the transitions leading to that state are always different. Similarly, for a given starting state, the parity bits of the transitions leading away from that state are always different.

The information bit $\chi$ that is associated with the upper horizontal transition in each butterfly in FIG. 5 is determined by the configuration of the constituent encoders of FIG. 1. The information bit $\chi$ will accordingly satisfy the equation:

$$B(\chi, 2b) = b$$

where b is the butterfly index value of the butterfly in question.

Then, it is possible to represent the forward metric calculations as:

$$\tilde{\alpha}_k^{2\times b} = \max\left\{\begin{array}{l}\left(\tilde{\alpha}_{k-1}^b + \left(\chi \times \left(\hat{x}_{k-1} + \frac{La_{k-1}^l}{L_c}\right)\right) + (\hat{z}_{k-1} \times c^{\chi,b})\right); \\ \left(\tilde{\alpha}_{k-1}^{b+\frac{M}{2}} + \left((1-\chi) \times \left(\hat{x}_{k-1} + \frac{La_{k-1}^l}{L_c}\right)\right) + (\hat{z}_{k-1} \times (1-c^{\chi,b}))\right)\end{array}\right\}$$

and thus the need to calculate the function B is eliminated from the forward metric calculation.

The symmetries within the butterflies can then be used in order to perform the computations for the other ending state in each butterfly, as follows:

$$\tilde{\alpha}_k^{2\times b+1} = \max\left\{\begin{array}{l}\left(\tilde{\alpha}_{k-1}^{b+\frac{M}{2}} + \left(\chi \times \left(\hat{x}_{k-1} + \frac{La_{k-1}^l}{L_c}\right)\right) + (\hat{z}_{k-1} \times c^{\chi,b})\right); \\ \left(\tilde{\alpha}_{k-1}^b + \left((1-\chi) \times \left(\hat{x}_{k-1} + \frac{La_{k-1}^l}{L_c}\right)\right) + (\hat{z}_{k-1} \times (1-c^{\chi,b}))\right)\end{array}\right\}$$

For example, for the butterfly b=0, $\chi$=0 and $c^{\chi,0}$=0 in the equation for $\tilde{\alpha}_k^0$ and $\chi$=1 and $c^{\chi,0}$=1 in the equation for $\tilde{\alpha}_k^1$.

In a similar manner, $$\tilde{\beta}_k^b = \max\left\{\begin{array}{l}\left(\tilde{\beta}_{k+1}^{2b} + \left(\chi \times \left(\hat{x}_k + \frac{La_k^l}{L_c}\right)\right) + (\hat{z}_k \times c^{\chi,2b})\right); \\ \left(\tilde{\beta}_{k+1}^{2b+1} + \left((1-\chi) \times \left(\hat{x}_k + \frac{La_k^l}{L_c}\right)\right) + (\hat{z}_k \times (1-c^{\chi,2b}))\right)\end{array}\right\}$$

$$\tilde{\beta}_k^{b+\frac{M}{2}} = \max\left\{\begin{array}{l}\left(\tilde{\beta}_{k+1}^{2b+1} + \left(\chi \times \left(\hat{x}_k + \frac{La_k^l}{L_c}\right)\right) + (\hat{z}_k \times c^{\chi,2b})\right); \\ \left(\tilde{\beta}_{k+1}^{2b} + \left((1-\chi) \times \left(\hat{x}_k + \frac{La_k^l}{L_c}\right)\right) + (\hat{z}_k \times (1-c^{\chi,2b}))\right)\end{array}\right\}$$

where $\chi$ this time satisfies the equation:

$$F(\chi,b)=2b$$

It will be apparent that the above equation for $\tilde{\beta}_k^b$ is independent of function F. The commonality in the structures of the equations given above for $\tilde{\alpha}_{k+1}^{2b}$, $\tilde{\alpha}_{k+1}^{2b+1}$, $\tilde{\beta}_k^b$ and $\tilde{\beta}_k^{b+M/2}$ can be exploited in the implementation of decoder 10 as will now be explained with reference to FIGS. 6 to 9.

Figure 3:
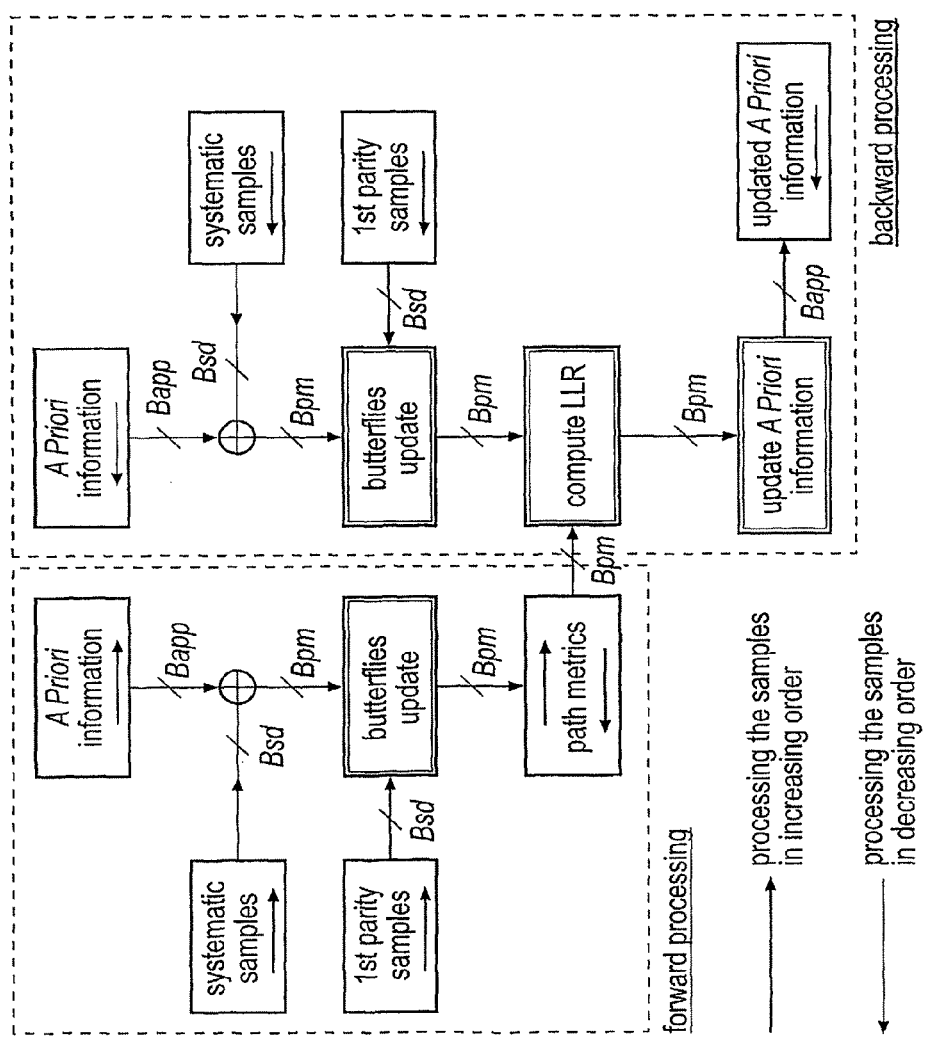
FIG. 3 illustrates decoding stages for decoding the first constituent code of FIG. 1.
Figure 4:
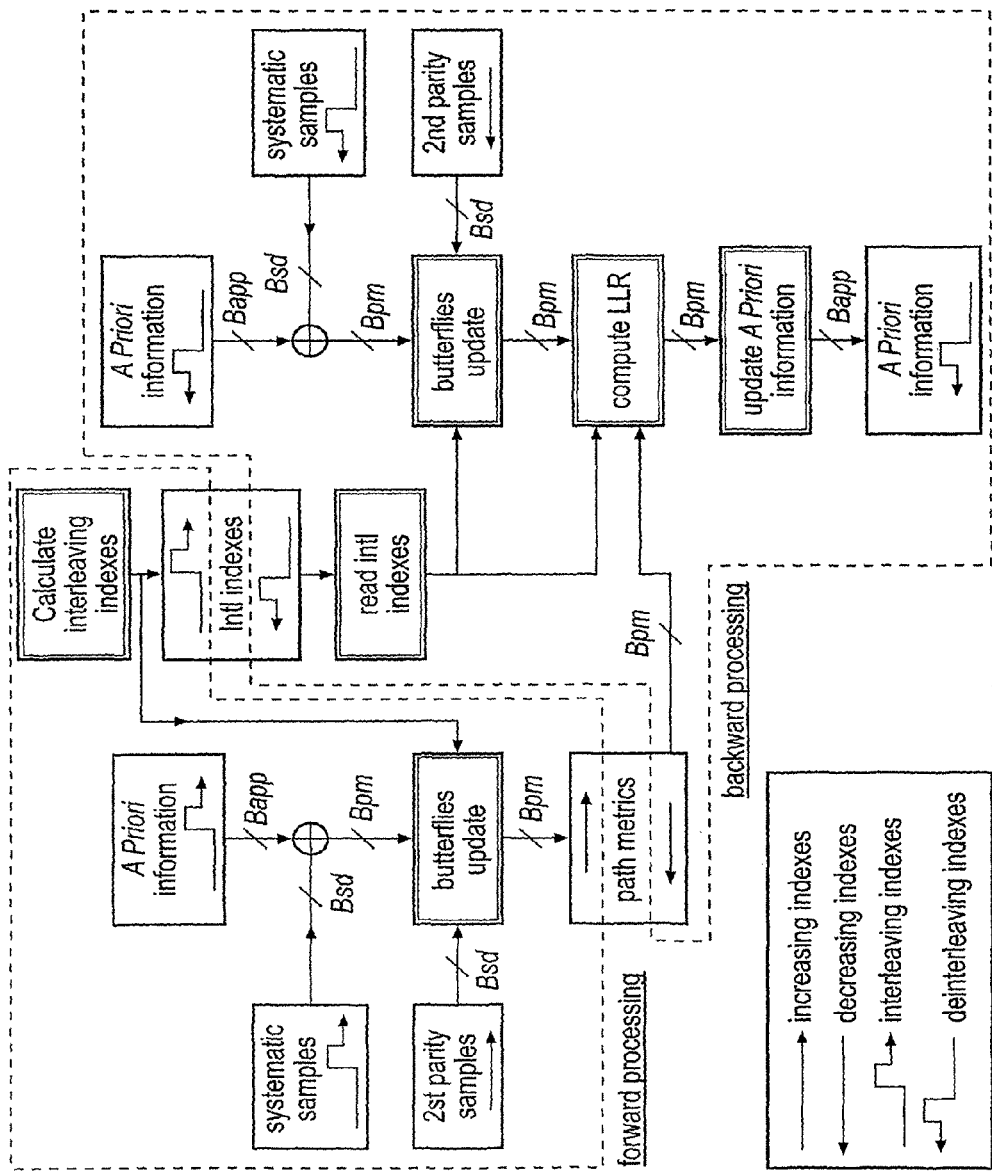
FIG. 4 illustrates decoding stages for decoding the second constituent code of FIG. 1.

FIG. 6 describes how the forward 'butterflies update' computations are performed. In FIG. 6, as in FIGS. 3 and 4, the word sizes in bits of the different inputs and outputs are indicated. Also, binary words are shown with bit significance increasing from left to right. For example, bit b0 of the butterfly index is more significant than bit b1.

FIG. 6 illustrates how the forward metrics are updated for a single butterfly; it will be understood that the operations shown in FIG. 6 are simply repeated for each of the other butterflies. The butterfly index 18 of the butterfly currently being processed is retrieved. The butterfly index 18 comprises two bits b1 and b0, the latter being the most significant bit. In the case of butterfly 0 in FIG. 5, b0, b1 is 00. The starting states for the butterfly are regenerated in step 20 by attaching a 1 and, in the alternative, a 0 to the most significant end of the butterfly index. Thus, the starting states produced are 0, b0, b1 and 1, b0, b1 as indicated generally at 22. In a similar manner, the end states of the butterfly are regenerated in operation 26 from the butterfly index 18 by attaching a 0 and, in the alternative, a 1 to the least significant end of the butterfly index. Thus, the ending states produced are, as generally indicated at 24, b0, b1, 0 and b0, b1, 1. The starting states regenerated from the butterfly index 18 are then used to retrieve forward path metrics from memory for modification and the end states are used to write back the modified path metrics to memory in the correct place. The path metrics associated with the starting states are stored in a single memory element of m×Bpm bits. By storing all of the path metrics in one word, rather than using m words of Bpm bits each, the number of memory accesses that are required is reduced. Once the path metrics word 30 has been retrieved, the starting states 24 regenerated from the butterfly index 18 are used to extract from the path metrics word 30 the upper starting state 32 and the lower starting state 34 of the butterfly. In the case where the butterfly index is 0, the path metric 32 is that of state 0 and the path metric 34 is that of state 4. The production of the values that are arithmetically combined with path metrics 32 and 34 will now be described.

In addition to specifying the start and end states for the butterfly that is currently being processed, the butterfly index 18 is also combined with a feedback polynomial 36 and a forward polynomial 38 in operations 40 and 42, respectively. The feedback polynomial 36 describes the position of the feedback taps in the constituent encoders of the Turbo encoding scheme that is now being decoded. Likewise, the forward polynomial describes the position of the feed-forward taps in the constituent encoders. The constituent encoders of FIG. 1 have the same structure such that a single forward polynomial 38 and a single feedback polynomial 36 describes both encoders. Within these polynomials, each bit corresponds to a tap position between the adjacent delay elements D (i.e. the connections described by the polynomials do not encompass the connections at the ends of lines of delay elements D), with 1 indicating an active tap and 0 indicating an inactive tap. Accordingly, the forward and reverse polynomials for the encoders shown in FIG. 1 are 10 and 01 respectively.

In operations 40 and 42, the butterfly index is combined in a bit-wise XOR operation with a respective one of the feedback and forward polynomials 36 and 38. The bits of the word r0, r1 produced by operation 40 are then XORed with one another to generate bit i0. Similarly, the bits of the word f0, f1 produced by operation 42 are XORed with one another to produce bit i1. The bits i0 and i1 are used as control inputs for process 44.

Process 44 takes as data inputs the value $\hat{z}_k$ and the value $$\hat{x}_k + \left(\frac{La_{k-1}^l}{L_c}\right).$$

The former value has a length Bsd bits and the latter has a length Bapp+1 bits. Process 44 allocates the branch metric values that are to be combined with the path metrics 32 and 34. In process 44, two parameters BM[0] and BM[1] are both set to 0 as an initial step. Next, BM[i0] is incremented by the value $$\hat{x}_k + \left(\frac{La_{k-1}^l}{L_c}\right).$$

Finally, the parameter BM[i1] is incremented by the value $\hat{z}_k$. The values of parameters BM[0] and BM[1] produced by process 44 now represent the branch metrics that are to be combined with the retrieved forward path metrics 32 and 34. Since the number of bits require to store the sum of the sample $\hat{x}_k$ and the a priori information is larger than, or equal to, number of bits used for the parity sample $\hat{z}_k$ (i.e., Bapp>Bsd), the branch metrics are allowed a length of Bapp+2 bits.

The branch metric BM[0] that is produced by process 44 is combined with retrieved path metrics 32 and 34 in operations 46 and 48 respectively. Likewise, branch metric BM[1] produced by process 44 is combined with retrieved path metrics 32 and 34 in operations 50 and 52 respectively. In essence, the same process takes place in each of operations 46 to 52. Within each of those operations, a retrieved path metric is added to a branch metric and the result is constrained to a length of Bpm bits which is caused to saturate if the addition result overruns the maximum value attainable using Bpm bits. Operation 54 then selects the maximum of the values produced by processes 46 and 52 and operation 56 selects the maximum of the values produced by processes 48 and 50. The value selected by operation 54 is the path metric 58 of the upper end state of the current butterfly and the value selected by operation 56 is the path metric 60 of the lower end state in the current butterfly. For example, if the butterfly index is 1, then path metric 58 belongs to state 2 and path metric 60 belongs to state 3 of the trellis. The path metrics 58 and 60 are written into a path metric word 62 for time index k+1 at the correct points as dictated by the calculated end states 24. When all of the butterflies for time index k have been processed, the path metrics word 62 is written back to memory. Like path metrics word 30, path metrics word 62 is Bpm×m bits long and contains all of the forward path metrics for the states of the trellis at time index k+1 in a concatenated configuration.

FIG. 7 shows how the scheme illustrated in FIG. 6 can be adapted to calculate the backward path metrics in addition to the forward path metrics. In FIG. 7, elements that have been carried over from FIG. 6 retain the same reference numerals.

In FIG. 7, the pairs of states 22 and 24 that are regenerated from the butterfly index 18 are simply used to describe the end states and the start states, respectively, of the current butterfly when backward path metrics are being computed. Otherwise, the pair of states 22 is treated as the start states and the pair of states 24 is treated as the end states of the current butterfly in order to carry out forward metric computations. It is also to be noted that when the scheme shown in FIG. 7 is used to compute backward metrics, then word 30 represents the backward path metrics from time index k+1, word 62 represents the backward path metrics for time index k, metrics 32 and 34 are the upper and lower starting state metrics of the current backward path metrics butterfly and metrics 58 and 60 are the upper and lower end state metrics of that butterfly. It will also be recognised that the outputs of operations 46 to 52 represent the γ values used in the equation presented earlier:

$$\tilde{\beta}_k^m = \max_{j \in \{0,1\}} (\tilde{\gamma}_k^{j,m})$$

Accordingly, the outputs of operations 46, 52, 50 and 48 have been labelled $\tilde{\gamma}_0$ to $\tilde{\gamma}_3$.

FIG. 8 illustrates how the forward and backward metrics calculation scheme shown in FIG. 7 can be used to calculate LLRs. As an initial step in the LLR generation process, the scheme of FIG. 7 is used to generate, and store into memory, the forward path metrics for all of the trellis stages in the current code block. Then, the code block is re-processed using the scheme shown in FIG. 7 to generate the backward path metrics. During the process of generating the backward path metrics for the end states of a given butterfly at a given stage of the trellis, the four values $\tilde{\gamma}_0$ to $\tilde{\gamma}_3$ are generated. These γ values have to be combined with the forward metrics of the end states of the current backward metric computation butterfly in order to generate the LLRs. As mentioned earlier, the LLRs are provided by the equation:

$$\tilde{\lambda}_k = \max_{m \in \{1, \ldots, M\}} (\tilde{\alpha}_k^m + \tilde{\gamma}_k^{1,m}) - \max_{m \in \{1, \ldots, M\}} (\tilde{\alpha}_k^m + \tilde{\gamma}_k^{0,m})$$

Since the γ values can be used to generate the LLRs on the fly, and since the backward path metrics of a stage k+1 of the trellis are only required to generate the backward path metrics of stage k of the trellis, there is no need to provide for long term storage of the backward path metrics. The backward path metrics of a given stage only need to be retained long enough to complete the calculation of the backward path metrics of the subsequent stage. Thus, in FIG. 7, the path metrics word 62 can, when complete, be written back to the memory location from which path metrics word 30 was retrieved.

In FIG. 8, elements carried over from FIGS. 6 and 7 retain the same reference numerals. In FIG. 8, the process shown in FIG. 7 for generating the values $\tilde{\gamma}_0$ to $\tilde{\gamma}_3$ for a given butterfly of a given stage of the trellis in the backward metric computations is denoted 64. The process 64 outputs a new set of values $\tilde{\gamma}_0$ to $\tilde{\gamma}_3$ for each butterfly that is processed at each stage of the trellis.

In order to calculate the LLRs for the trellis stage of the end states of the backward metric butterfly that is currently being processed, the forward path metrics word 66 that was calculated earlier for that stage is retrieved. In operation 68, two forward path metrics 70 and 72 are retrieved from the forward path metrics word 66. The path metrics 70 and 72 are, respectively, the forward path metrics of the upper and lower end states of the backward path metric butterfly that is currently the subject of process 64. Operation 68 selects metrics 70 and 72 using the pair of states 22 that process 64 generates (see FIG. 7) from the butterfly index of the current butterfly.

Forward path metric 70 is used in operations 74 and 76 and forward path metric 72 is used in operations 78 and 80. In essence, each of operations 74 to 80 is the same and comprises the addition of one of the forward path metrics 70 and 72 with one of the values y7 to y3. In each of operations 74 to 80, the result of the addition process is constrained to a word length equal to that used for the forward path metric 70 and 72, i.e. Bpm bits. If the result produced in any of operations 74 to 80 over runs the allowed Bpm bits, then the result is saturated to the maximum result available using Bpm bits.

The allocation of the values $\tilde{\gamma}_0$ to $\tilde{\gamma}_3$ to the operations 74 to 80 is controlled by a switch operation 82. The switch operation 82 is controlled by the signal i0 that is produced in process 64 from the current value of the butterfly index 18 and the feedback polynomial 36 (see FIG. 6 or 7). If the signal bit i0 has the value 0, then the values $\tilde{\gamma}_0$ to $\tilde{\gamma}_3$ are supplied, respectively, to operations 74, 76, 80 and 78. On the other hand, if signal bit i0 has the value 1, then the values $\tilde{\gamma}_0$ to $\tilde{\gamma}_3$ are supplied, respectively, to operations 74, 76, 78 and 80. During the processing of a given trellis stage by process 64, each of operations 74 to 80 will produce four results, one result for each butterfly. Operation 84 identifies the maximum of the M values that are produced by operations 74 and 78 and operation 86 identifies the maximum value amongst the M values that are produced by operations 76 and 80. Finally, in operation 88, the difference between the two maximum values identified by operations 84 and 86 is calculated to provide an LLR value for the current trellis stage.

FIG. 9 shows how the LLRs can be used to update the a priori information that is to be used in the next iteration I+1 of the decoding process. As shown in FIG. 9, the LLR for the current trellis stage is subtracted from the sum of the systematic sample $\hat{x}_k$ and the current a priori information $$\frac{La_k^l}{Lc}.$$

The result of the subtraction process then undergoes non-linear scaling to produce the a priori information for the next iteration, $$\frac{La_k^{l+1}}{Lc}.$$

The foregoing embodiment has been described largely in terms of operations and processes. It will be understood, however, that these operations and processes can be carried out by, for example, dedicated hardware, such as an ASIC, or a general purpose data processor with appropriate software. FIG. 10 illustrates the former example and illustrates a mobile telephone 90. A signal received by the antenna 92 of the telephone 90 undergoes frequency downconversion, amplification and analog to digital conversion in RF section 94. The signal is also processed by multipath compensation unit 96 which may take the form of, for example, an equaliser or a rake receiver. FEC section 98, which comprises an ASIC arranged to carry out the operations and processes described with reference to FIGS. 6 to 9, operates on the signal in order to perform Turbo decoding. The output of the FEC section 98 is then put to the appropriate use elsewhere within the telephone, e.g. reconstruction of an audio signal or a video signal for presentation to a user. It will be apparent to the skilled person that FIG. 10 gives a brief overview only and omits, for the sake of brevity, many details of the operation of the telephone 90 since such information is unnecessary for the simple purpose of setting the processing techniques of FIGS. 6 to 9 in an example context.

The invention claimed is:

1. A method of calculating branch metrics for a butterfly in a trellis of a MAP-genre decoding algorithm, the method comprising:
    generating, in an electronic communication receiving device, first and second control signals by combining a butterfly index of the butterfly with polynomials describing tap positions of encoding equipment to whose operation the trellis relates;
    initialising first and second branch metrics;
    selecting one of the first and second branch metrics and incrementing it with a systematic sample; and
    selecting one of the first and second branch metrics and incrementing it with a parity sample,
    wherein the branch metric to be incremented with the systematic sample is selected by the first control signal and the branch metric to be incremented with the parity sample is selected by the second control signal.

2. The method according to claim 1, wherein the branch metric incremented with the systematic sample is further incremented with an a priori information value.

3. The method according to claim 1, wherein the polynomials describing said tap positions are forward and feedback polynomials and said forward and feedback polynomials are used in the derivation of said control signals.

4. A method of calculating state metrics for a trellis, the method comprising calculating first state metrics through the trellis in a first direction by a first state metric update process that, for each of at least one butterfly in the trellis, comprises calculating branch metrics for the butterfly using the method of the type claimed in claim 1.

5. The method according to claim 4, wherein said first state metric update process further comprises regenerating start and end states for at least one butterfly from a corresponding butterfly index or indices.

6. The method according to claim 4, further comprising calculating second state metrics through the trellis in a second direction opposite to the first direction by a second state metric update process that, for each of at least one butterfly in the trellis, comprises calculating branch metrics for the butterfly.

7. The method according to claim 6, wherein said second state metric update process further comprises regenerating start and end states for at least one butterfly from a corresponding butterfly index or indices.

8. The method according to claim 6, wherein the second state metric update process, for each of at least one butterfly, comprises combining the branch metrics of the butterfly with the second state metrics of the starting states of the butterfly to produce candidate metrics for the second state metrics of the end states of the butterfly and selecting candidate metrics to become the second state metrics of the end states of the butterfly and the method further comprises combining, for each of at least one trellis stage, the candidate metrics of the stage with the first state metrics of the stage as a step in producing a log likelihood ratio for the stage.

9. A set of software instructions stored in a non-transitory computer readable medium for causing a data processing apparatus to perform the method according to claim 1.

10. An apparatus for calculating branch metrics for a butterfly in a trellis of a MAP-genre decoding algorithm, the apparatus comprising:
    means for generating first and second control signals by combining a butterfly index of the butterfly with polynomials describing tap positions of the encoding equipment to whose operation the trellis relates:
    means for initialising first and second branch metrics;
    means for selecting one of the first and second branch metrics and incrementing it with a systematic sample; and
    means for selecting one of the first and second branch metrics and incrementing it with a parity sample,
    wherein the branch metric to be incremented with the systematic sample is selected by the first control signal and the branch metric to be incremented with the parity sample is selected by the second control signal.

11. The apparatus according to claim 10, wherein the branch metric incremented with the systematic sample is further incremented with an a priori information value.

12. The apparatus according to claim 10, wherein the polynomials describing said tap positions are forward and feedback polynomials and said forward and feedback polynomials are used in the derivation of said control signals.

13. The apparatus for calculating state metrics for a trellis, the apparatus comprising means for calculating first state metrics through the trellis in a first direction and apparatus according to claim 10 for calculating branch metrics for said first state metric calculating means.

14. The apparatus according to claim 13, wherein said first state metric calculation means is arranged to regenerate start and end states for at least one butterfly from a corresponding butterfly index or indices.

15. The apparatus according to claim 13, further comprising means for calculating second state metrics through the trellis in a second direction opposite to the first direction and apparatus for calculating branch metrics for said second state metric calculating means.

16. The apparatus according to claim 15, wherein said second state metric update calculation means is arranged to regenerate start and end states for at least one butterfly from a corresponding butterfly index or indices.

17. The apparatus according to claim 15, wherein the second state metric calculation means is arranged to, for each of at least one butterfly, combine the branch metrics of the butterfly with the second state metrics of the starting states of the butterfly to produce candidate metrics for the second state metrics of the end states of the butterfly and to select candidate metrics to become the second state metrics of the end states of the butterfly and the apparatus further comprises means for combining, for each of at least one trellis stage, the candidate metrics of the stage with the first state metrics of the stage as a step in producing a log likelihood ratio for the stage.

* * * * *